(12) United States Patent
De Jong et al.

(10) Patent No.: US 6,812,690 B2
(45) Date of Patent: Nov. 2, 2004

(54) INTEGRATED CIRCUIT WITH POWER SUPPLY TEST INTERFACE

(75) Inventors: Franciscus Gerardus Maria De Jong, Eindhoven (NL); Rodger Frank Schuttert, Eindhoven (NL); Johannes De Wilde, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 15 days.

(21) Appl. No.: 10/116,598

(22) Filed: Apr. 4, 2002

(65) Prior Publication Data

US 2002/0153876 A1 Oct. 24, 2002

(30) Foreign Application Priority Data

Apr. 9, 2001 (EP) .............................................. 01201306

(51) Int. Cl.$^7$ ................................................ G01R 31/26
(52) U.S. Cl. .................................. 324/158.1; 324/765
(58) Field of Search ................................ 324/765, 750, 324/144, 117 R, 117 H, 763, 158.1, 263, 529

(56) References Cited

U.S. PATENT DOCUMENTS

| | | | | |
|---|---|---|---|---|
| 4,052,748 A | | 10/1977 | Kuijk | ........................ 360/113 |
| 4,321,640 A | | 3/1982 | van Gestel | ................... 360/113 |
| 4,686,472 A | | 8/1987 | Van Ooijen et al. | ........ 324/252 |
| 5,028,866 A | | 7/1991 | Wiese | ........................ 324/158 |
| 5,399,975 A | | 3/1995 | Laing et al. | ................. 324/537 |
| 5,488,294 A | * | 1/1996 | Liddell et al. | ......... 324/207.21 |
| 5,570,034 A | * | 10/1996 | Needham et al. | ........... 324/763 |
| 5,912,556 A | * | 6/1999 | Frazee et al. | ............. 324/207.2 |
| 5,963,038 A | | 10/1999 | De Jong et al. | ............ 324/537 |
| 6,064,220 A | * | 5/2000 | Sugasawara et al. | ........ 324/765 |
| 6,281,697 B1 | * | 8/2001 | Masuda et al. | ............. 324/765 |
| 6,429,640 B1 | * | 8/2002 | Daughton et al. | ...... 324/117 R |
| 6,518,782 B1 | * | 2/2003 | Turner | ........................ 324/760 |

FOREIGN PATENT DOCUMENTS

| | | | | |
|---|---|---|---|---|
| DE | 4027049 | | 3/1991 | ......... G01R/33/032 |
| DE | 4430243 | | 3/1995 | ......... G01R/31/302 |
| EP | 0344834 A1 | | 5/1989 | ........... G01R/31/28 |
| EP | 0415439 A2 | | 8/1990 | ........... G01R/15/02 |
| EP | 0655628 | | 5/1995 | ......... G01R/33/025 |
| WO | WO9746891 | | 6/1997 | ......... G01R/31/303 |

* cited by examiner

*Primary Examiner*—Kamand Cuneo
*Assistant Examiner*—Tung X. Nguyen
(74) *Attorney, Agent, or Firm*—Michael J. Ure

(57) ABSTRACT

An integrated circuit assembly contains a carrier and a semi-conductor integrated circuit chip 10. A current path on the carrier supplies power to power supply connection of the chip. A magnetic field sensor is provided on the carrier in a vicinity of the current path, for sensing a magnetic field generated by a current through the current path. The assembly contains test-accessible electronic interface to the magnetic field sensor, for testing presence of the current. Preferably the sensors are integrated on the carrier by depositing magneto resistive material and patterning the material so as to provide sensors in the vicinity of current paths. Also preferably, the carrier is an interposer 12 with connecting wiring, which is packaged with one or more integrated circuit chips before mounting the interposer on a printed circuit board 19.

13 Claims, 5 Drawing Sheets

INTEGRATED CIRCUIT WITH POWER SUPPLY TEST INTERFACE

FIELD OF THE INVENTION

The invention relates to testing of connections to an integrated circuit that is mounted on a carrier.

BACKGROUND ART

From U.S. Pat. No. 5,963,038 it is known to provide a magnetic field sensor in an integrated circuit chip to test whether a power supply connection of the chip carries current.

Modern integrated circuit chips have many power supply connections. It is expected that in the near future more than 30% of the available connections to integrated circuit chips will involve power supply connections. This abundance of power supply connections poses a serious test problem, because the power supply connections tend to be interconnected outside and inside the chip. As a result, failure of a power supply connection does not always show up as a significant voltage drop of the power supply voltage inside the chip, or anywhere else, and so detection of the absence or presence of a supply voltage is no answer to the test problem. Also the chip processes data normally under most circumstances when one or a few of the power supply connections fail, so that the failure does not always show up in functional tests (tests that check whether test data is processed properly).

This has led to the proposal of techniques to perform testing by measuring currents through the power supply connections. One technique is to measure the voltage drop over a resistance in the supply path. The circuitry for such a measurement impose strict circuit requirements because such a resistance would either have to be very small or lead to a reduced supply voltage.

An alternative technique is to detect a magnetic field generated by the current through a power supply connection. U.S. Pat. No. 5,399,975 teaches the use of a probe that is held near to a power supply connection for the purpose of this test. However, this technique is cumbersome, because it requires special probes and accurate positioning of these probes. Moreover, this technique does not work when the current paths to the power supply connections are not individually accessible from outside the IC package, for example when they are underneath the IC package, between the package and a printed circuit board. Use of an external probe to access individual current paths is also impossible when a chip is packaged together with an interposer circuit on which connections are made between different power supply connections and possibly to other chips mounted on the same interposer circuit.

U.S. Pat. No. 5,963,038 solves this problem by integrating magnetic field sensors on the integrated circuit chip in the vicinity of a current paths from the various power supply connections. By integrating the sensors on chip it becomes straightforward to place the sensors in positions where they can detect currents and it becomes economically feasible to include a great number of sensors, each for a specific power supply connection.

The sensors may be implemented for example using magneto-resistive material deposited on the chip or by patterning conductor tracks on chip as pick-up coils. The sensors are connected to on-chip test circuitry to perform current detection and to report the result of the current detection on a test output (for example a scan chain interface).

Although U.S. Pat. No. 5,963,038 solves the problem of testing the operation of individual power supply connections, it has been found that the described sensors cannot always be realized. A pick-up coil does not operate satisfactorily on (semi-) conducting substrates (such as a silicon substrate). Magneto-resistive materials are not always compatible with materials used for integrated circuit chip manufacture. Moreover, when a power supply network is provided on a carrier outside the integrated circuit chip, and this network provides for alternative power supply routes, the sensors of U.S. Pat. No. 5,963,038 are not suitable for detecting disruptions in power supply routes in this network.

SUMMARY OF THE INVENTION

Amongst others, it is an object of the invention to provide for an alternative way testing of current paths through power supply connections of an integrated circuit chip, notably a way of testing which does not result in incompatibility with integrated circuit manufacturing technology.

It is another object of the invention to provide for testing current paths through power supply connections of an assembly of integrated circuit chips of which not all integrated circuit chips contain provisions for such testing.

It is yet another object of the invention to provide for testing current paths through power supply connections on a carrier for integrated circuit chips.

The invention provides for an integrated circuit assembly, comprising a semi-conductor integrated circuit chip with a power supply connection;

a carrier to which the integrated circuit chip is attached;

an external power supply terminal;

a current path on the carrier, connecting the external power supply terminal and the power supply connection;

a magnetic field sensor on the carrier in a vicinity of the current path, but outside the integrated circuit chip, for sensing a magnetic field generated by a current through the current path;

a test-accessible electronic interface to the magnetic field sensor, for testing presence of the current.

By placing magnetic field sensors on the carrier, the problems of integrating such sensors in the integrated chip is solved. Moreover, this enables the testing of individual connections on the carrier.

An interposer, on which one or more integrated circuit chips are packaged before assembly on a printed circuit board has been found to be a suitable carrier for integrating magnetic field sensors. The power supply paths to the power supply connections of the integrated circuit chip are well accessible for sensors on the interposer, because these paths run on the interposer. Moreover, since the interposer is manufactured separately from the integrated circuit chip, only to be attached to the completed chip, its manufacture is not incompatible with that of the chip.

Preferably, the magnetic field sensors are integrated on the carrier, that is, they are not pre-manufactured sensors solder onto the carrier, but sensors that are manufactured on the carrier. It has been realized that techniques that have been developed to manufacture heads for magnetic recording (see for example U.S. Pat. No. 4,321,640 (applicants ref PHN 9107), U.S. Pat. No. 4,686,472 (applicants ref PHN 10016) or U.S. Pat. No. 4,052,748 (applicants ref PHN 7469) and the references cited therein) can be readily applied to integrated manufacture of carriers with many magnetic sensors at low cost. In particular, photolithographic patterning of magnetoresistive material is suitable for realizing a large number of magnetic sensors on a carrier. However, other kinds of magnetic field sensors, such as pick up coils or Hall effect sensors may also be integrated on the carrier.

Preferably, individual sensors are provided for a plurality of power supply conductors of the same power supply potential, for one or more different power supply potentials (e.g. 3.3 V and ground) and for one or more different integrated circuit chips. In an embodiment, a number magneto-resistive elements used as sensors are connected electrically in series so that their resistance can be determined using a common current source and shared tap points between successive magneto-resistive elements.

There are many advantageous embodiments of reading the magnetic sensors. In a first embodiment, sensor results are read into the integrated circuit chip, or into another integrated circuit chip mounted on the same carrier (preferably the same interposer), processed in that chip and output via a test output of that chip. Thus, the test can be handled substantially within the assembly of chip (or chips) and carrier, at a small cost of additional circuits on chip. In a second embodiment, the interposer contains a circuit for reading and outputting test results outside the chip, preferably using a scan chain interface. Thus, no additional access pads are needed on the chip.

A sensor may be connected to an access pad on the interposer. In a third embodiment the access pad is accessible from outside the encapsulation of the assembly of the interposer and the chip. In a fourth embodiment the access pad extends outside a region of the interposer that is covered by the chip. After the test, the access pads may be left internal in the encapsulation, i.e. not accessible from the outside. Thus, the assembly of interposer and chip can be tested before encapsulation.

BRIEF DESCRIPTION OF THE DRAWING

These and other advantageous aspects of the invention will be described in more detail using the following figures.

DETAILED DESCRIPTION OF THE EMBODIMENTS

Figure 1:
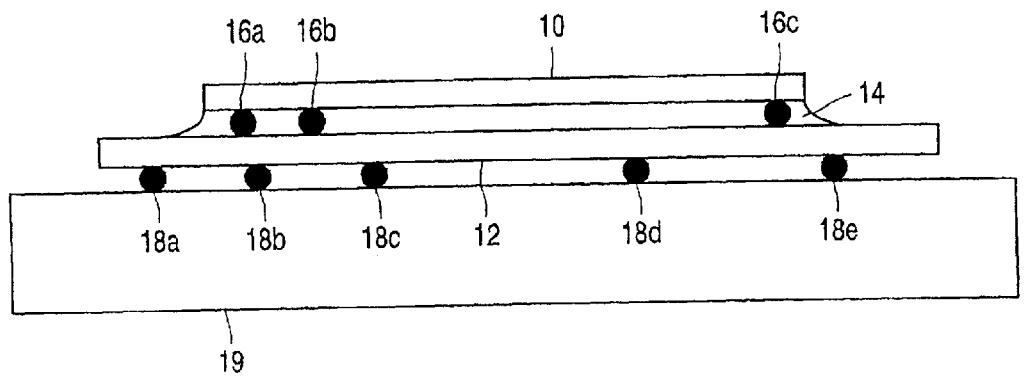
FIG. 1 shows a side view of a cross-section of an assembly of an integrated circuit chip and an interposer

FIG. 1 shows a side view (not drawn to scale) of an assembly of an integrated circuit chip 10 and an interposer 12 on a printed circuit board 19. The integrated circuit chip 10 is electrically connected to conductors (not shown separately) in the interposer 12 by solder bumps 16a–c (without deviating from the invention other connections between the chip 10 and the interposer 12, such as wire-bonds may be used instead of solder bumps). Normally, more than one integrated circuit chip 10 will be included on the interposer 12, but for the sake of clarity only the case of one integrated circuit chip 10 is shown. The assembly is mounted on a printed circuit board 19, to which it is connected by connections to the outside 18a–e (for example solder bumps, but other types of connection may be used).

Interposer 12 contains conductors (not shown) and metallized holes (not shown) for connecting conductors from the printed circuit board 19 to pads of integrated circuit chip 10. These conductors and holes may also be used to interconnect integrated circuit chip 10 with other integrated circuit chips (not shown) on the interposer. Both the interposer 12 and the printed circuit board 19 form are a carrier (directly or indirectly) for integrated circuits.

In normal use the assembly of integrated circuit chip 10 and interposer 12 (excluding the integrated circuit board 19) will be contained in an encapsulation that leaves substantially only the part of the assembly 10, 12, 14 that is exposed to the printed circuit board externally accessible.

Figure 2:
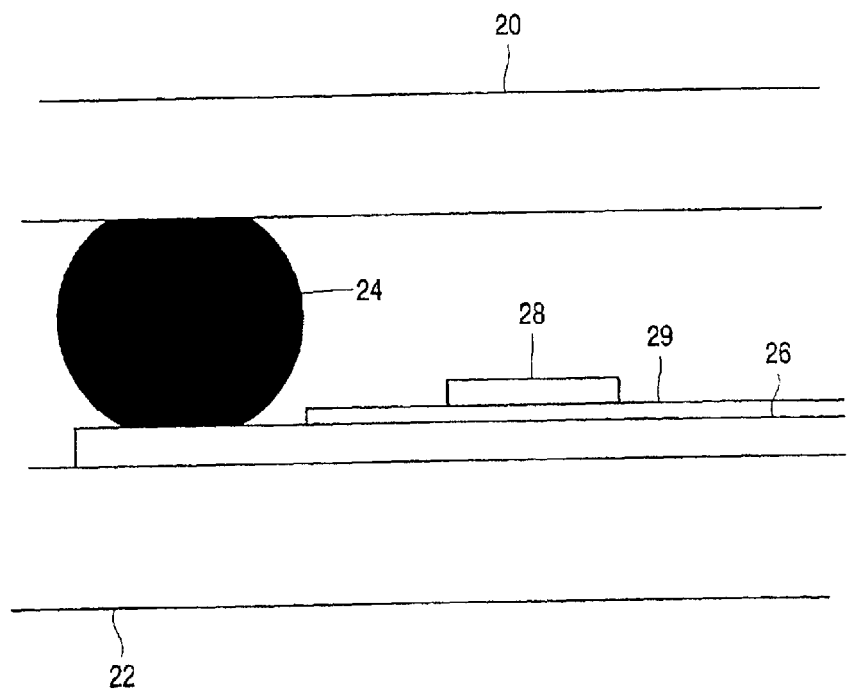
FIG. 2 shows a side view of a cross-section of a detail of an assembly.

FIG. 2 shows a side view of a cross-section of a detail of the assembly (not drawn to scale; different reference numerals have been used for like items as compared to FIGS. 1 and 2). The side view shows the integrated circuit chip 20, a substrate 22 of the interposer, a solder bump 24, a conductor 26 on the substrate 22, a piece of magneto-resistive material 28, and an isolation layer 29. The solder bump 24 connects a power supply pad (not shown) of integrated circuit chip 20 to conductor 26, which forms part of a current path for power supply current from the printed circuit board (not shown) to the power supply pad.

The interposer contains the substrate 22, the conductor 16, the isolation layer 29 and the magneto-resistive material 28 attached to each other. The magneto-resistive material covers part of the conductor 26, but is isolated therefrom by isolation layer. The conductor 26 is made for example of copper, aluminium, gold or any other conductive material. The magneto-resistive material 28 is for example Ni—Fe. The isolation layer is for example made of a 40 nanometer layer of quartz.

Figure 3:
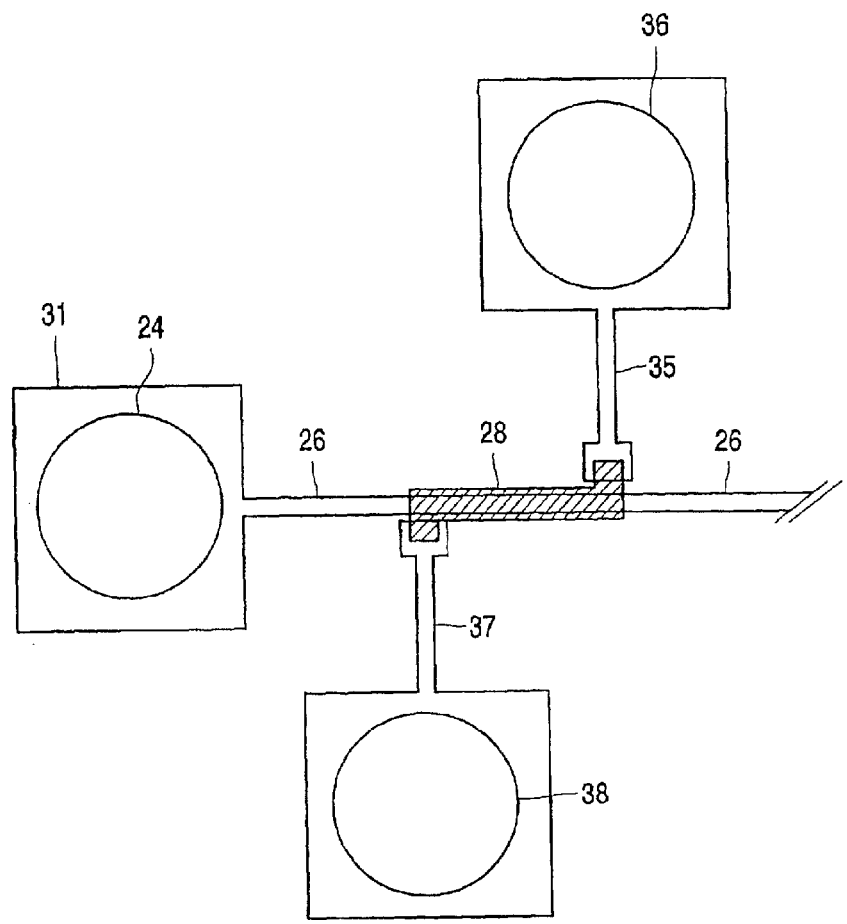
FIG. 3 shows a top view of an assembly.

FIG. 3 shows a top view of a cross-section of a detail of the assembly (not shown to scale). The top view shows the conductor 26, which widens into a pad 31 on the interposer. On the pad, the solder bump 24 is shown that connects the conductor 26 to the power supply connection of the integrated circuit chip (not shown). Magneto-resistive material 28 is shown patterned in an essentially elongated region of for example 1 micrometers wide and 10 micrometers long, with side flaps connected to measurement conductors 35, 37 to which measurement solder bumps 36, 38 are connected (there is no isolation layer 29 between the measurement conductors 35, 37 and the magneto-resistive material 28).

In operation, conductor 26, 31 serves to supply a power supply current to the integrated circuit chip 20 via solder bump 24. This current causes a magnetic field, with field lines circling the conductor 26, so that the field impinges on the magneto-resistive material 28 essentially perpendicularly to the direction of greatest length of the magneto-resistive material 28. The distance between the magneto-resistive material 28 and the conductor 26 is so small that the magnetic field at the material 28 is mostly determined by the current through the conductor 26 and not by the earth's magnetic field, fields from other conductors etc. The magneto-resistive material 28 serves as a magneto-resistive resistor. The magnetic field causes a change in the resistance of magneto-resistive resistor, which is measured though measurement solder bumps 36, 38 and measurement conductors 35, 37.

Thus, the presence or absence of a current along the conductor 26 can be tested, without introducing additional resistance in the conductor. This is especially suitable for testing the operationality of power supply conductors on the interposer. The sensors can be arranged very close to the conductors under test, which substantially eliminates disturbance by stray magnetic fields, such as the earth's magnetic field, magnetic fields from power supply units, loudspeakers etc. of the apparatus in which the assembly is used.

A technology for integrating patterned magneto-resistive material on an interposer is for example known from techniques for manufacturing magnetic reading heads. Briefly, a layer of magneto-resistive material like Ni—Fe is deposited over an isolation layer that covers a pattern of conductor tracks. A photo sensitive layer is deposited over the magneto-resistive layer, exposed and developed so as to allow position sensitive etching of the magneto-resistive layer.

In case of magneto resistive material the direction of current through the material should preferably perpendicular to the direction of the magnetic field. Therefore, the material 28 is preferably deposited over the conductor 26 with its current supplying terminals at different positions along the conductor. Preferably, the magneto-resistive material does not extend so far as to reach regions where the magnetic field created by the current through the conductor 26 has decreased significantly. In practice, a width/length ratio of 1:10 has been found satisfactory for the magneto-resistive material 28.

It will be appreciated that the location of the measurement solder bumps 36, 38 is not critical: they may be located at any distance from the material 28. A number of areas of material 28, interconnected by measurement conductors 35, 37, may be connected in series or in parallel between two solder bumps.

Similarly, the position of the material 28 along the conductor track 20 is not critical, since current, if present, flows along the length of the track. However, in order to detect harmful short circuits with other power supply conductors, the material 28 is preferably located adjacent the power supply connection solder bump 24 for connection to the integrated circuit chip. Preferably similar material 28 is also provided adjacent connections for solder bumps for connection to the printed circuit board.

Of course the invention is not limited to NI—Fe or indeed to magneto-resistive materials that require a field perpendicular to the measurement current to create a magneto resistive effect. Any material 28 whose resistivity depends on a magnetic field can be used, with a measurement current flowing in a direction relative to the conductor track 26 under test so as to make the resistance field dependent on the field generated by a current through the conductor track 26.

Also, other effects than magneto-resistive effects may be used. For example one might use the Hall effect. As is well known, the Hall effect causes a voltage across a resistive material in a first direction perpendicular to a second direction of a measurement current flowing though that material if a magnetic field component is present perpendicular to these two directions. Hence, a rectangle of material located in parallel to the conductor 26, not over it, but next to it (as viewed in FIG. 3) may be used, so as to pick up a field. On one pair of opposite sides this material can be connected to a current source, whereas the other pair of sides is connected to a voltage measuring device to detect the Hall voltage caused by the magnetic field. As another alternative, a pick coil may be used next to the conductor 26.

Conductors for signals are preferably tested by detecting signals on these conductors using normal boundary scan techniques, but of course the magnetic sensing techniques described herein can also be applied to these conductors.

Figure 4:
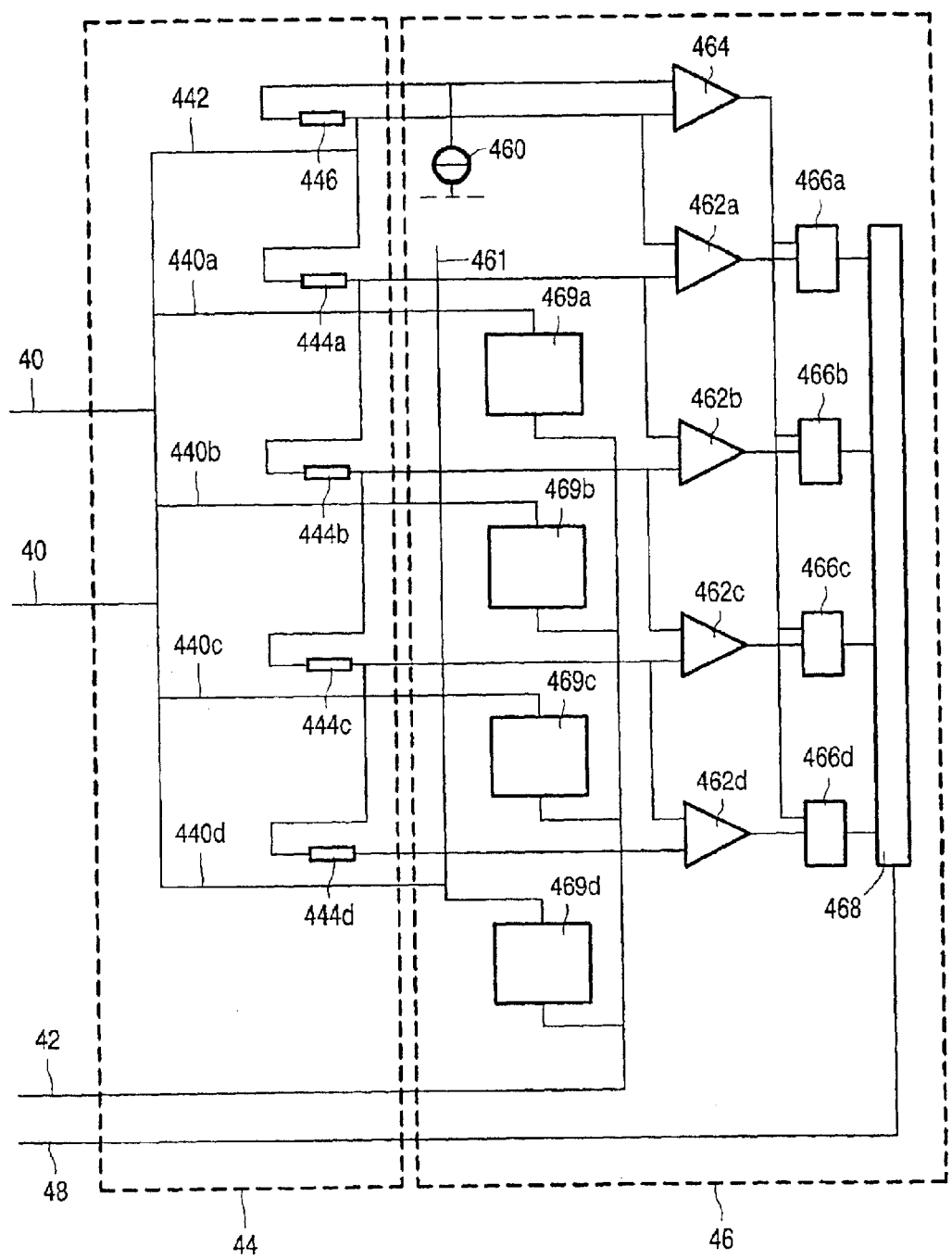
FIG. 4 shows a circuit for testing power supply connections.

FIG. 4 shows a part of circuit containing the interposer 44 and the integrated circuit chip 46 for testing a magneto-resistive voltage drop. The circuit has external power supply connections 40 for a first power supply (e.g. for 3.3 V or some other supply voltage) connected to functional parts 469a–d of the integrated circuit chip 46, via interposer 44. Another power supply connection 42 (e.g. for "ground") is also connected to the integrated circuit chip 46 via interposer 44. In practice many other power supply lines, data lines and signal lines will also be connected to the functional parts 469a–d of the integrated circuit chip 46 via the interposer 44, but these lines have been omitted for the sake of clarity. Also, the second power supply connection 42 will in practice be connected at many points to integrated circuit chip 46, but for the sake of clarity only one connection is shown (preferably the power supply conductors on the interposer to all of these connections will be tested using magneto-resistive sensors as described herein as well).

The interposer 44 contains conductors 440a–d between the connections 40 for the first power supply and power supply connections of the integrated circuit chip 46. Each conductor 440a–d supplies a respective one of the power supply connections of the integrated circuit chip 46. Interposer 44 contains magneto-resistive resistors 444a–d located with their longest axis over respective ones of the conductors 440a–d. The interposer 44 also contains a dummy power supply line 442, which is not connected to the integrated circuit chip 46 and a magneto-resistive reference resistor 446 with its longest axis over the dummy power supply line 442.

The magneto-resistive resistors 444a–d are connected in a series arrangement which also contains magneto-resistive reference resistor 446. Conductors on the interposer 44 connect the resistors 444a–d, 446 in series. Connection points in the between resistors 444a–d, 446 in the series arrangement are connected to the integrated circuit chip 46.

The integrated circuit chip 46 contains functional circuits 469a–d. The function of the functional circuits, which is the main function of the integrated circuit chip 46, is immaterial for the invention. It can be any desired function. The functional circuits 44a–d may have various interconnections (not shown).

Integrated circuit chip 46 contains a power supply rail 461 to which all first power supply conductors 440a–d are coupled (e.g. via solder bumps). From the power supply rail the functional circuits 469a–d are supplied with power.

Furthermore, integrated circuit chip 46 contains a current source 460, differential amplifiers 462a–d, a further differential amplifier 464, comparator circuits 466a–d and test shift register 468.

The current source 460 is connected to the series arrangement of resistors 444a–d, 446 on the interposer 44, so as to supply a measurement current that flows through the resistors 444a–d, 46. As shown in FIG. 4, the series arrangement 444a, 446 is connected between the current source 460 and the second power supply connection 48, but other connections may be used instead of the second power supply connection 48. The connection points between the resistors 444a–d, 446 are connected to inputs of the differential amplifiers 462a–d, 464, so that each pair of connection points that is connected to the terminals of a respective one of the resistors 444a–d, 446 is connected to a respective one of the differential amplifiers 462a–d, 464. The terminals of the magneto resistive reference resistor 446 are connected to the inputs of the further differential amplifier 464. Each differential amplifier 462a–d has an output coupled to a first input of a respective one of the comparator circuits 466a–d. An output of the further differential amplifier is coupled to a second input of all of the comparator circuits 466a–d. The comparator circuits 466a–d have outputs coupled to parallel inputs of the test shift register 468, which in turn has an output coupled to the test output 48 of the circuit.

In operation, power supply current normally flows through the power supply conductors 440a–d to the power supply rail 461. This power supply current causes magnetic fields around the power supply conductors 440a–d. These magnetic field in turn affect the resistance of resistors 444a–d.

Current source 460 supplies a measurement current through resistors 444a–d. This current leads to voltage drops across the resistors 444a–d. These voltage drops depend on the magnetic fields, and therefore on the power supply current through the power supply conductors 442a–d. The voltage drops are amplified by differential amplifiers 462a–d, so that the voltages at the outputs of these differential amplifiers 462a–d relative to ground are a function of the voltage drops across the resistors 444a–d.

The measurement current also flows through magneto-resistive reference resistor 446. The resistance value of this reference resistor 446 is substantially unaffected by a magnetic field, because no current runs through its associated dummy power supply line 442. The differential amplifiers 462a–d and the further differential amplifier has substantially equal amplification factors. The voltage drop over the reference resistor 446 is amplified by further differential amplifier 464 and the output of further differential amplifier 464 is compared with that of the differential amplifiers 462a–d by comparator circuits 466.

The comparator circuits 466a–d output binary signals indicating whether the voltage drops over respective ones of the resistors 444a–d over the power supply conductors 440a–d differ more than a threshold amount from the voltage drop over the reference resistor 446. The outputs of comparator circuits 466a–d are latched into shift register 468 and shifted out of the circuit via test signal conductor 48 during a test phase.

When the power supply current in a supply path to the integrated circuit chip 46 or in the integrated circuit chip is interrupted, this will show up as a different voltage drop over a resistor 444a–d that corresponds to the supply path. The different voltage drop will be signaled by a comparator circuit 466a–d and read out of the circuit via test signal conductor 48.

It will be appreciated that FIG. 4 is shown only as an example of a circuit for testing power supply connections according to the invention. Many alternative embodiments are possible. For example, the resistors 444a–d, 446 may be provided in parallel instead of in series, each with its own current source and amplifier 462a–d In this case the terminals of the resistors 444a–d, 446 opposite the current sources may be connected via a common connection. (The amplifiers 462a–d may be omitted in this case, the voltages at the nodes between the current sources and the resistors being coupled directly to the comparator circuits 466a–d). This has the advantage that the circuits in the integrated circuit chip are simpler, but the parallel arrangement requires less current sources. Also a combination of parallel and series arrangements may be used.

Similarly, although the embodiment uses a reference resistor 446, preferably made of the same material and the same dimensions as the resistors 444a–d so as to facilitate the comparison of the voltage drops across the resistors 444a–d, it will be appreciated that a reference resistor is not essential. A different kind of reference may be used, or the voltage drops across different ones of the resistors 444a–d adjacent normal power supply conductors may be compared. Also the reference resistor does not necessarily need to be provided over a dummy power supply line 442, although the latter makes comparison more accurate.

Similarly, more or fewer than four parallel connections 440a–d for the same power supply may be provided each with a magneto-resistive resistor. These connections need not necessarily be connected on the interposer 44 or by the power supply rail 461. The number of external connections 40, 42 may also vary.

The comparator circuits 466a–d and/or amplifiers 462a–d may be shared by different resistors 444a–d, using a multiplexer to select the resistor over which the voltage drop is measured. The amplifiers 462a–d need not amplify, they may attenuate the voltage drop or leave its size unaffected: it suffices that the amplifiers relate the measured voltage drop and the reference voltage drop to a common potential.

Furthermore, it will be appreciated that the invention is not limited to detection of the test results in the integrated circuit chip. Alternatively, amplifiers etc. for testing the voltage drop caused by the currents may be located elsewhere on the interposer.

Figure 5:
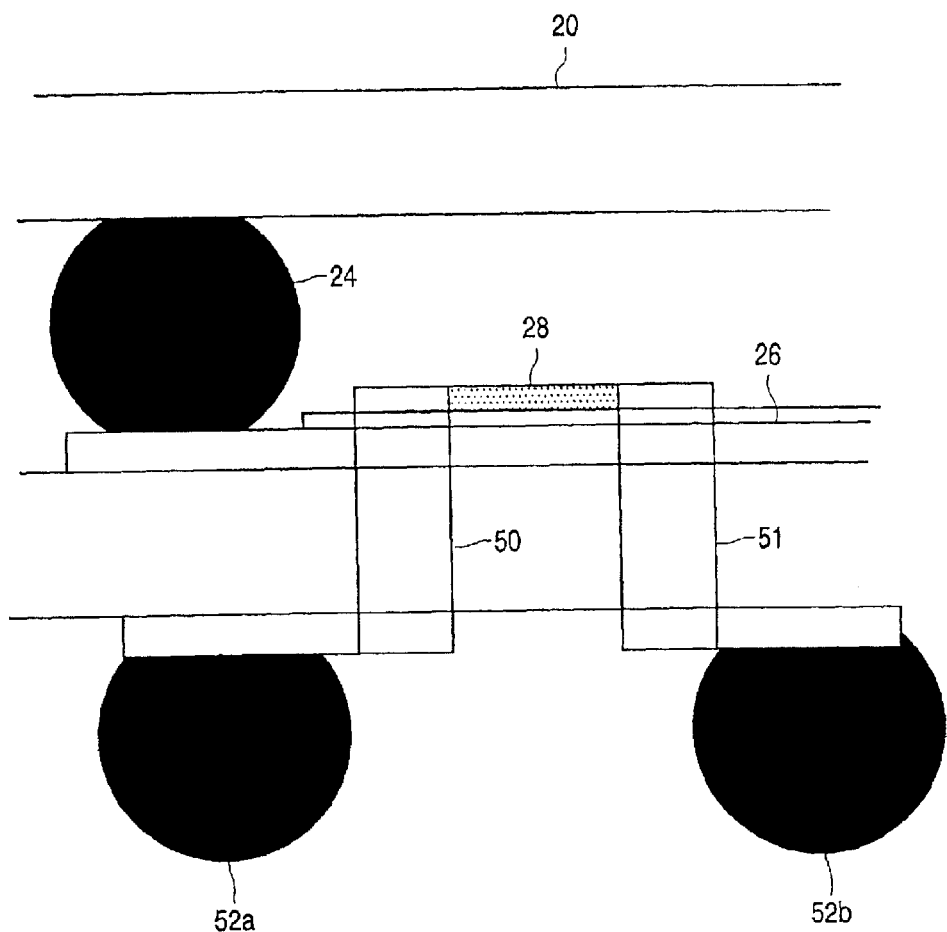
FIG. 5 shows a further assembly.

FIG. 5 shows a view of an assembly for use with test circuits outside the assembly, for example on the printed circuit board on which the assembly is mounted. It will be appreciated that although the view looks like a cross-section, such as FIG. 2, various elements are shown that are in fact at different distances from the viewer. The arrangement of conductor 26 and material 28 is similar to that of FIG. 3, but conductors 50, 51 through the substrate 22 have been provided so as to contact solder bumps 52a,b for access to material 28 on the outside of the assembly (of course the conductors 50, 51 are at a different distance from the viewer than the conductor 26 under test).

Figure 6:
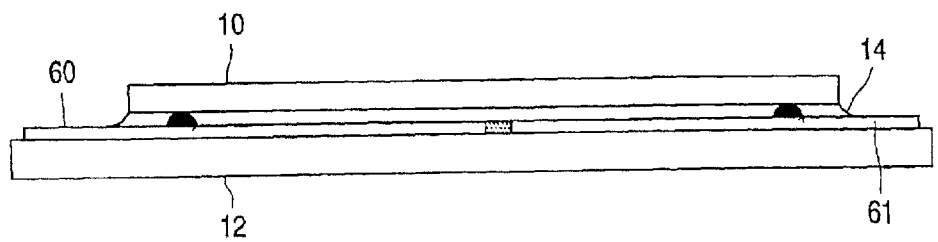
FIG. 6 shows another assembly.

FIG. 6 shows a view of the assembly where contact pads 60, 61 for access to the material 28 are located outside the region of the interposer 12 that is covered by the integrated circuit chip 10. Thus, the test measurements can be performed with a tester before the assembly is encapsulated. No expenses have to be made for terminals to access the sensor once the assembly has been packaged.

Figure 7:
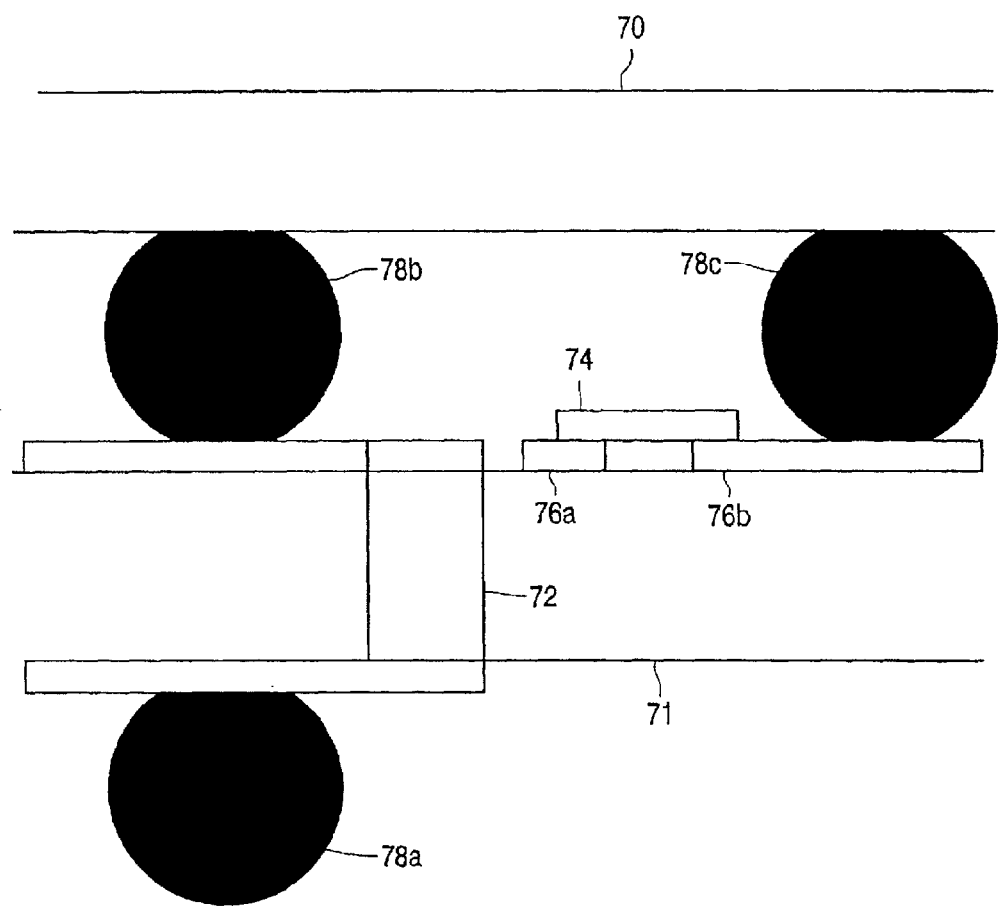
FIG. 7 shows a side view of a cross-section of a further embodiment.

FIG. 7 shows a side view of a cross-section of a further embodiment where a sensor has been included to test currents flowing through a connection though the substrate of the interposer. FIG. 7 shows an integrated circuit 70, a substrate 71, a through-connection 72, a magneto resistive layer 74, testconductors 76a,b and solder bumps 78a,b. A power supply path runs from the outside of the assembly via a first one of the solder bumps 78a, the through-connection 72 and a second one of the solder bumps 78b to the integrated circuit chip 70. Adjacent the through-connection 72 magneto-resistive material 74 is provided, which runs radially, radiating from the through-connection 72. Material 74 is accessible via test conductors 76a,b. A solder bump 78c for accessing the magneto resistive material 74 via one of the test conductors 76a is shown (as similar solder bump (not shown) is provided for the other test conductor 76b).

In operation, absence or presence of current in through connection 72 is detected from resistance changes in material 74. This detection is performed in integrated circuit chip 70.

What is claimed is:

1. A device for detecting a current in a connection of an integrated circuit, comprising:

a semi-conductor integrated circuit chip with a power supply connection;

a carrier to which the integrated circuit chip is attached;

an external power supply terminal;

a current path on the carrier, which connects the external power supply terminal and the power supply connection;

a magnetic field sensor on the carrier in a vicinity of the current path, but outside the integrated circuit chip, wherein the magnetic field sensor senses a magnetic field generated by the current through the current path;

measurement conductor operatively coupled to the magnetic field sensor, for testing presence of the current.

2. A device according to claim 1, wherein the magnetic field sensor comprises a magneto-resistive material deposited on the carrier.

3. A device according to claim 2, wherein the material has been patterned on the carrier in one or more regions in the vicinity of the current path.

4. A device according to claim 2 containing a plurality of magnetic field sensors of said magneto-resistive material deposited on the carrier in respective vicinities of respective current paths leading to respective power supply connections of the integrated circuit chip and/or further integrated circuit chips attached to the carrier.

5. A device according to claim 4, wherein the carrier comprises connecting conductors for establishing electrically in series coupling of the magneto-resistive materials of the magnetic field sensors.

6. A device according to claim 1, wherein the carrier is an interposer, for mounting one or more integrated circuit chips connected together on an printed circuit board, the assembly comprising a package that encapsulates the integrated circuit chip and at least part of the interposer, including the sensor.

7. A device according to claim 6, the measurement conductor comprising a terminal on an outside of the package, the terminal being coupled to read out the sensor.

8. A device according to claim 1, wherein an electronic processing part is integrated in the integrated circuit chip.

9. A device according to claim 1, further comprising:

another intergrated circuit chip mounted on the carrier, and an electronic processing part integrated in the further integrated circuit chip for reading the magnetic field sensor and transferring a result of said reading to an output terminal of the carrier.

10. A device according to claim 9, further comprising:

another magnetic field sensor on the carrier in a vicinity of a further current path to a power supply connection of the further integrated circuit chip, wherein the another magnetic field sensor senses a magnetic field generated by a current through the further current path.

11. A device according to claim 8, wherein the magnetic field sensors are coupled to a scan chain interface, which serially reads-out test results from respective ones of the magnetic field sensors.

12. A device according to claim 1, wherein the carrier contains a substrate, and the current path includes a through connection through the substrate, the sensor being provided in the vicinity of the through connection.

13. A method of testing an Integrated circuit assembly with an integrated circuit chip attached to a carrier with current paths for giving access to circuits in the integrated circuit chip, the method comprising: measuring an electric voltage representative of a magnetic field generated by a power supply current on an interposer, wherein a sensor far the magnetic field is used that is integrated on the carrier, outside the integrated circuit.

* * * * *